United States Patent [19]
Otsuki

[11] Patent Number: 5,719,442
[45] Date of Patent: Feb. 17, 1998

[54] RESIN SEALING TYPE SEMICONDUCTOR DEVICE

[75] Inventor: Tetsuya Otsuki, Suwa, Japan

[73] Assignee: Seiko Epson Corporation, Tokyo, Japan

[21] Appl. No.: 555,016

[22] Filed: Nov. 13, 1995

[30] Foreign Application Priority Data

Nov. 11, 1994 [JP] Japan ................... 6-303238
Aug. 30, 1995 [JP] Japan ................... 7-245417

[51] Int. Cl.$^6$ ........................ H01L 23/34
[52] U.S. Cl. ............ 257/712; 257/179; 257/796
[58] Field of Search ................ 257/796, 714, 257/720, 719, 712; 438/106, 122, 127

[56] References Cited

U.S. PATENT DOCUMENTS

| | | |
|---|---|---|
| 3,212,569 | 10/1965 | McAdam . |
| 3,290,564 | 12/1966 | Wolff, Jr. . |
| 3,965,277 | 6/1976 | Guditz et al. . |
| 4,151,543 | 4/1979 | Hayakawa et al. . |
| 4,684,975 | 8/1987 | Takiar et al. . |
| 4,942,497 | 7/1990 | Mine et al. . |
| 5,050,040 | 9/1991 | Gondusky et al. . |
| 5,105,259 | 4/1992 | McShane et al. . |
| 5,157,478 | 10/1992 | Ueda et al. . |
| 5,172,213 | 12/1992 | Zimmerman . |
| 5,198,964 | 3/1993 | Ito et al. .................. 257/796 |
| 5,200,809 | 4/1993 | Kwon . |
| 5,202,288 | 4/1993 | Doering et al. . |
| 5,208,188 | 5/1993 | Newman . |
| 5,227,662 | 7/1993 | Ohno et al. . |
| 5,229,643 | 7/1993 | Ohta et al. . |
| 5,252,855 | 10/1993 | Ogawa et al. . |
| 5,262,927 | 11/1993 | Chin et al. . |
| 5,328,870 | 7/1994 | Marrs . |
| 5,367,196 | 11/1994 | Mahulikar et al. . |
| 5,381,042 | 1/1995 | Lerner et al. . |
| 5,440,169 | 8/1995 | Tomita et al. ................. 257/796 |
| 5,444,025 | 8/1995 | Sono et al. . |
| 5,455,462 | 10/1995 | Marrs . |

FOREIGN PATENT DOCUMENTS

| | | |
|---|---|---|
| 0 164 794 A2 | 12/1985 | European Pat. Off. . |
| 0 253 295 | 1/1988 | European Pat. Off. . |
| 0 399 300 | 11/1990 | European Pat. Off. . |
| 0 436 126 A2 | 7/1991 | European Pat. Off. . |
| 0 500 965 | 9/1992 | European Pat. Off. . |
| 0 539 095 A2 | 4/1993 | European Pat. Off. . |
| 44 00 341 | 7/1994 | Germany . |
| 54-124678 | 9/1979 | Japan . |
| 56-122134 | 9/1981 | Japan . |
| 58-12341 | 1/1983 | Japan . |

(List continued on next page.)

OTHER PUBLICATIONS

English Abstract of Japanese Patent Publication No. 59 110127.

English Abstract of Japanese Patent Publication No. 03 082060.

English Abstract of Japanese Patent Publication No. 61 090488.

English Abstract of Japanese Patent Publication No. 02 252273.

*Primary Examiner*—Wael Fahmy
*Assistant Examiner*—Roy Potter
*Attorney, Agent, or Firm*—Oliff & Berridge, P.L.C.

[57] ABSTRACT

A resin sealing type semiconductor device includes an internal heat radiator having an element placing surface, a semiconductor element bonded to the element placing surface and leads which are separated from the semiconductor element. Wires electrically connect the leads to the electrodes of the semiconductor element. An insulator is located between the internal heat radiator and the leads. A resin package is formed exposing an exposed area of the internal heat radiator. A heat radiating fin is bonded to the exposed area of the internal heat radiator by a solder layer therebetween. The dimension S1 of the exposed area is equal to or larger than the dimension S2 of the bonding area of the heat radiating fin and the solder layer.

21 Claims, 11 Drawing Sheets

FOREIGN PATENT DOCUMENTS

| | | |
|---|---|---|
| 59-207645 | 11/1984 | Japan . |
| 61-166051 | 7/1986 | Japan . |
| 62-97358 | 5/1987 | Japan . |
| 63-179557 | 7/1988 | Japan . |
| 63-240053 | 10/1988 | Japan . |
| 6-66351 | 3/1989 | Japan . |
| 2-307251 | 12/1990 | Japan . |
| 3-222464 | 10/1991 | Japan . |
| 3-280453 | 12/1991 | Japan . |
| 4-10558 | 1/1992 | Japan . |
| 4-11758 | 1/1992 | Japan . |
| 4-27145 | 1/1992 | Japan . |
| 4-91458 | 3/1992 | Japan . |
| 4-158556 | 6/1992 | Japan . |
| 4-174551 | 6/1992 | Japan . |
| 4-199664 | 7/1992 | Japan . |
| 4-230056 | 8/1992 | Japan . |
| 4-316357 | 11/1992 | Japan . |
| 5-211262 | 8/1993 | Japan . |
| 6-53390 | 2/1994 | Japan . |
| 6-97321 | 4/1994 | Japan . |
| 6-97326 | 4/1994 | Japan . |

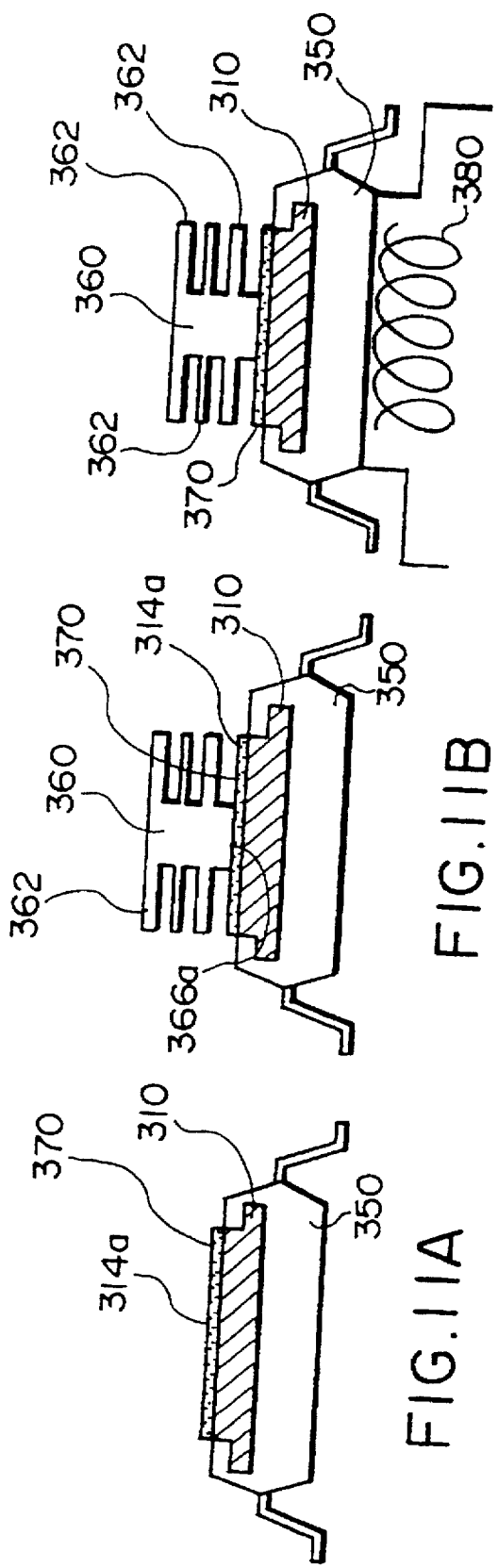
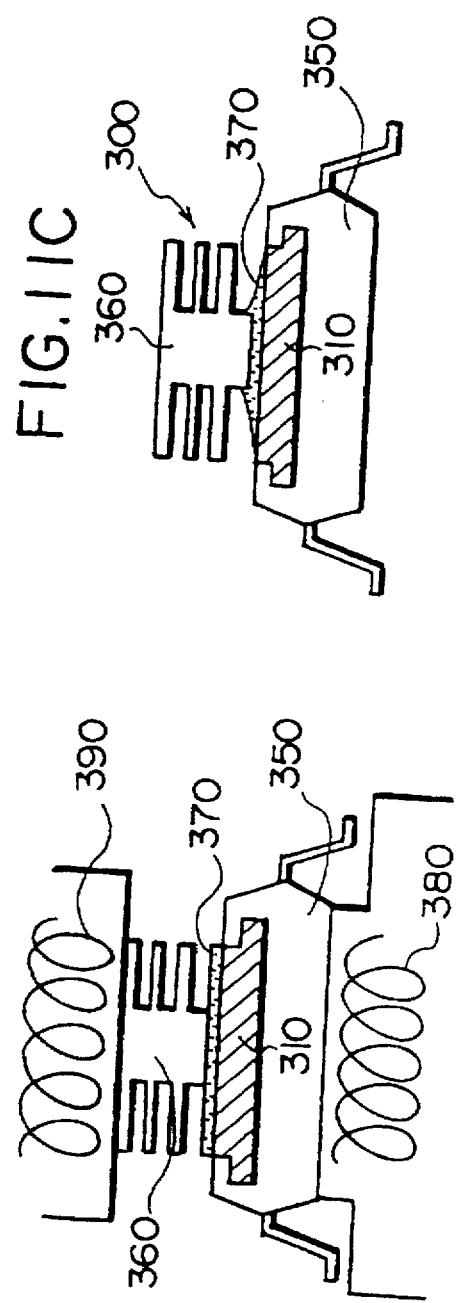
FIG.11A
FIG.11B
FIG.11C
FIG.11D
FIG.11E

RESIN SEALING TYPE SEMICONDUCTOR DEVICE

BACKGROUND OF THE INVENTION

1. Field of the Invention

The invention relates to a semiconductor device with external and internal heat radiators and a method of making such a semiconductor device.

2. Description of Related Art

In recent years, semiconductor chips show a tendency to have high integration and power dissipation and thus increase the heating value. Packages for such semiconductor chips are usually made of ceramics which are highly heat-resistant. However, ceramic packages have some drawbacks. For example, such packages make semiconductor devices too large, complicate the production processes and increase the manufacturing cost. Thus, to resolve the above drawbacks of ceramic packages, resin sealing type packages have been proposed.

To provide high heat radiating properties in the resin sealing type semiconductor devices, materials increasing the thermal conductivity of a lead frame or sealing resin have been under consideration. In terms of structure, modifying the design of a lead frame and providing an additional heat radiating member are also under consideration. Furthermore, it is now considered that the addition of a heat radiating member for improving the heat radiating properties of the package is extremely effective for Large Scale Integrated circuits in which their power consumption is substantially equal to two to three watts per chip.

For example, JP 2-307251 discloses a technique in relation to the above techniques. As shown in FIG. 13, the semiconductor device comprises a semiconductor chip 3 which is electrically connected to internal leads 2 through wires 4, and a resin member 1 which seals the chip 3, wires 4 and internal leads 2. An opening is partially formed in the resin member 1. The opening leads to one side of the semiconductor chip 3 and is filled with highly thermally conductive adhesive 5. The heat radiating fin 6 is formed on the surface of the adhesive 5.

The above semiconductor device increases heat radiating properties since the heat radiating fin 6 is mounted on the high heat conductive silicone resin adhesive 5. However, the heat radiating fin 6 is separated from the semiconductor chip 3 by the resin material and the adhesive 5. Therefore, the prior art semiconductor device has slightly inferior heat conductivity, and weak bonding of the metallic heat radiating fin 6 to the resin adhesive 5 because they are made of different materials.

SUMMARY OF THE INVENTION

An object of the invention is to provide a resin sealing type semiconductor device which has increased heat radiating properties, and which can be adopted to any high-power semiconductor devices, and also to provide a method of making such a semiconductor device. Thus, the invention provides a resin sealing type semiconductor device comprising a semiconductor element mounted on an internal heat radiator. A resin package seals the internal heat radiator and defines a portion of the internal heat radiator as an exposed area. A solder layer is disposed on the exposed area of the internal heat radiator. An external heat radiator is bonded to the solder layer at a bonding area and mounted on the internal heat radiator. The exposed and bonding areas are formed so that the bonding area is attracted toward the central part of the exposed area by the surface tension formed by the solder layer when the solder layer is in a molten state.

In such an arrangement, the semiconductor element and internal heat radiator which are main heat producing sources are bonded together either directly or having element receivers such as lead frame islands therebetween. In addition, the internal and external heat radiators are bonded together sandwiching the solder layer in between. Therefore, the arrangement can provide higher heat radiating effects. For example, both the internal and external heat radiators may be made of metal. Thus, all the heat radiating members bonded to each other through the solder can provide high heat conductivity.

The exposed area of the internal heat radiator and the bonding area of the external heat radiator are configured in the aforementioned manner. The external heat radiator can be automatically positioned through the surface tension of the molten solder formed while bonding the external and internal heat radiators. This ensures accurate and simple assembly of the semiconductor device.

The molten solder adheres to the exposed and bonding areas under the molten solder's surface tension (adhesion between liquid and solid). The portions of the exposed and bonding areas to which the molten solder adheres are then attracted to each other under the surface tension (cohesive force of liquid), so that the external heat radiator moves on the surface of the molten solder layer. The external heat radiator stops at a point where the surface tension substantially uniformly acts on all the outer edges of the bonding area. Thus, the external heat radiator can be automatically positioned.

The invention also provides a resin sealing type semiconductor device comprising a semiconductor element having electrodes, an internal heat radiator having an element placing surface for mounting the semiconductor element, and leads separated from the semiconductor element. Wires electrically connect the leads with the electrodes. An insulator is located between the internal heat radiator and the leads. A resin package seals the internal heat radiator and defines a portion of the internal heat radiator as an exposed area. A solder layer is disposed on the exposed area of the internal heat radiator. An external heat radiator is bonded to the solder layer at a bonding area and mounted on the internal heat radiator. The exposed and bonding areas are formed so that the bonding area is attracted toward the central part of the exposed area by the surface tension formed from melting the solder layer.

In addition to the aforementioned configuration of the exposed and bonding areas, such an arrangement can improve the heat radiating effects because the semiconductor element is bonded directly to the internal heat radiator.

The invention further provides a resin sealing type semiconductor device comprising a semiconductor element mounted on an internal heat radiator. A resin package seals the internal heat radiator and defines a portion of the internal heat radiator as an exposed area. A solder layer is disposed on the exposed area of the internal heat radiator. An external heat radiator is bonded to the solder layer at a bonding area and mounted on the internal heat radiator. The exposed area is equal to or larger than the bonding area.

When the exposed area is equal to or larger than the bonding area, it is possible to utilize the surface tension of the molten solder formed by the bonding of external and internal heat radiators so that the external heat radiator can be automatically positioned.

The invention further provides a resin sealing type semiconductor device comprising a semiconductor element having electrodes, an internal heat radiator having an element placing surface for mounting the semiconductor element, and leads separated from the semiconductor element. Wires electrically connect the leads with the electrodes. An insulator is located between the internal heat radiator and the leads. A resin package seals the internal heat radiator and defines a portion of the internal heat radiator as an exposed area. A solder layer is disposed on the exposed area of the internal heat radiator. An external heat radiator is bonded to the solder layer at a bonding area and mounted on the internal heat radiator. The exposed area is equal to or larger than the bonding area.

It is preferred to improve the heat radiating effect by bonding the semiconductor element directly to the internal heat radiator.

It is desirable that the solder layer forms a fillet by the surface tension when melted and the exposed area is larger than the bonding area by the area of the fillet projected onto the exposed area.

The fillet is formed by the surface tension of the molten solder. More particularly, the fillet is formed by the adhering force of the molten solder to the exposed and bonding areas and the cohesive force of the molten solder.

The exposed and bonding areas are provided in the above manner. Thus, it is possible to position and reproduce the external heat radiator reliably, when it is bonded to the internal heat radiator.

It is also desirable that the configuration of the exposed area is similar to that of the bonding area.

Thus, it is possible to position the external heat radiator accurately. The bonding area is disposed on the center of the exposed area because the surface tension of the molten solder acting on the center of the exposed area is balanced at all the edges of the bonding area.

It is preferable that the resin sealing type semiconductor device of the invention further comprises an element receiver. The element receiver is mounted on the internal heat radiator and has an element placing surface. The element placing surface is mounted on the semiconductor element for indirectly fixing the semiconductor element to the internal heat radiator.

The resin sealing type semiconductor device of the invention is provided by a method comprising:

mounting a lead frame including leads on an internal heat radiator through an insulator, mounting a semiconductor element on the internal heat radiator and electrically connecting the leads to the electrodes of the semiconductor element with wires;

molding a resin package for sealing the internal heat radiator and defining a portion of the internal heat radiator as an exposed area;

bonding the exposed area of the internal heat radiator to a bonding area of an external heat radiator through a solder layer; and heating and melting the solder layer so that the bonding area is attracted toward the central part of the exposed area by the surface tension built from the melted solder layer.

Furthermore, the resin sealing type semiconductor device of the invention is provided by a method comprising:

mounting a lead frame including leads on an internal heat radiator through an insulator, mounting a semiconductor element on the internal heat radiator and electrically connecting the leads to the electrodes of the semiconductor element through wires;

molding a resin package for sealing the internal heat radiator and defining a portion of the internal heat radiator as an exposed area;

bonding the exposed area of the internal heat radiator to a bonding area of an external heat radiator through a solder layer; the exposed area being equal to or larger than the bonding area; and heating and melting the solder layer so that the bonding area is attracted toward the central part of the exposed area by the surface tension built from the melted solder layer.

As described, these methods of the invention can easily and reliably assemble the internal and external heat radiators since the external heat radiator is automatically positioned on the exposed area, by the molten solder bonding the internal and external heat radiators.

The solder layer may be formed on at least one of the exposed and bonding areas of the internal and external heat radiators. It is however preferable that the solder layer is formed on each of the exposed and bonding areas. When the solder layers are formed on both areas, it is possible to solder the areas smoothly and obtain a desirable bonding. When the solder layer is formed on one of the exposed and bonding areas, it is desirable to form the solder layer on the exposed area which is larger than the bonding area. In such a case, the external heat radiator can be more easily positioned through the surface tension of the molten solder. When the amount of solder is sufficient, stable bonding is provided.

In the above methods of the invention, it is desirable that the solder layer is heated after heating the external heat radiator to a temperature of about 180° to 250° C., and more preferably about 180° to 200° C. and heating the resin package preferably to a temperature of about 100° to 200° C. and more preferably about 125° to 180° C. The external heat radiator and resin package are previously heated to the above range of temperatures, so that the solder can melt reliably and any adverse effects on the semiconductor element and resin sealing means due to rapid change of temperature may be prevented.

BRIEF DESCRIPTION OF THE DRAWINGS

The invention is described in detail with reference to the following drawings, wherein:

FIGS. 11A–11E illustrate a process of mounting an external heat radiator having three disc portions on the exposed area of a resin sealed internal heat radiator;

DETAILED DESCRIPTION OF THE PREFERRED EMBODIMENTS

Preferred embodiments of the invention are described below with reference to the drawings.

Figure 1:
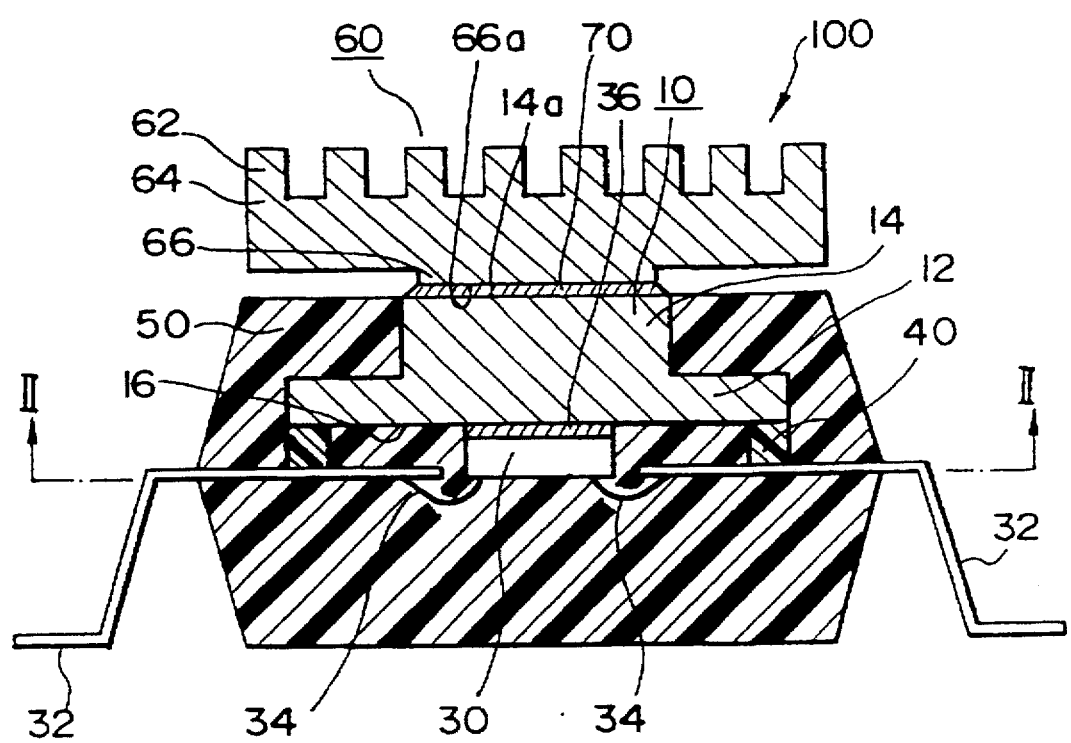
FIG. 1 is a cross-sectional view of a semiconductor device.
Figure 2:
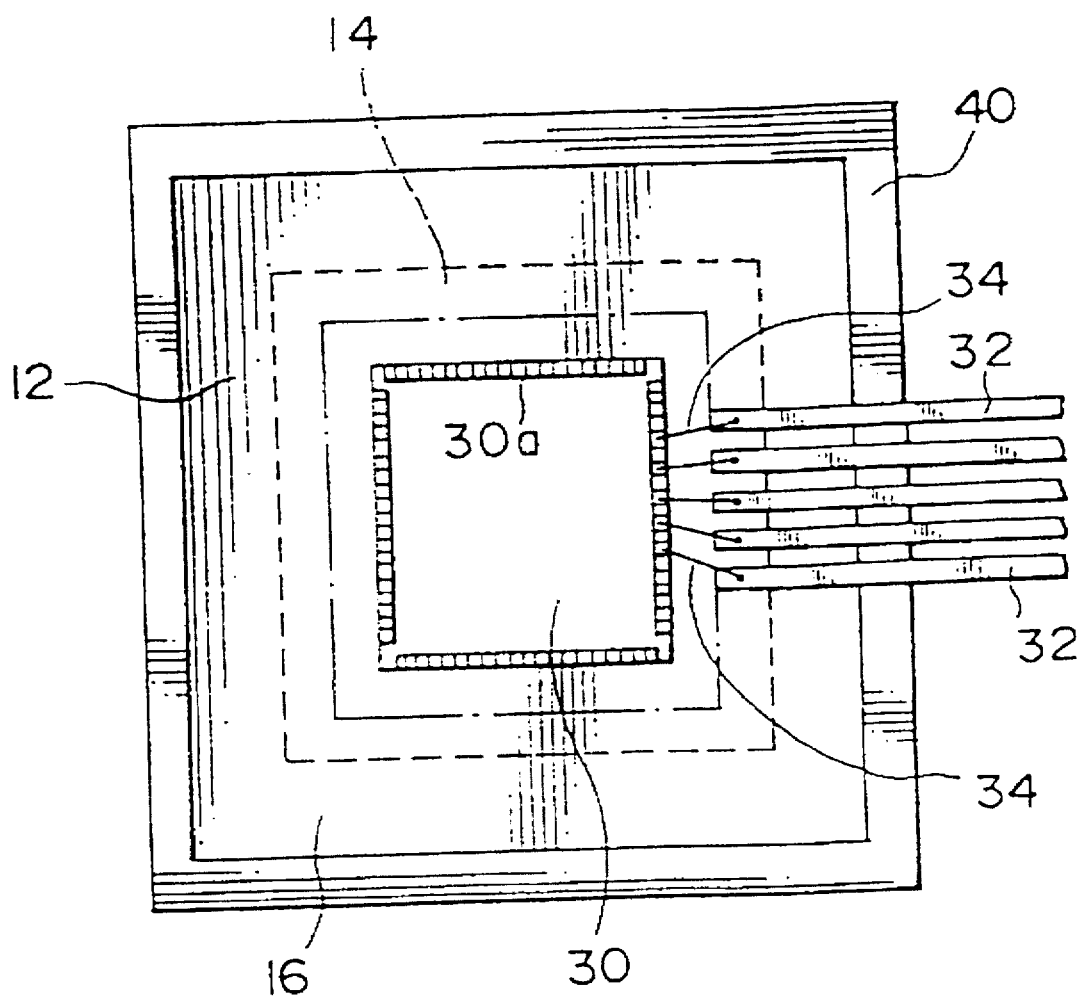
FIG. 2 is a plan view of the semiconductor device as taken along a line II—II in FIG. 1.

FIG. 1 is a cross-sectional view of a semiconductor device 100 constructed in accordance with the invention and FIG. 2 is a plan view of the semiconductor device taken along a line II—II in FIG. 1.

The semiconductor device 100 comprises an internal heat radiator 10 and leads 32 disposed over a surface of the internal heat radiator 10. An insulator 40 is disposed between the leads 32 and the internal heat radiator 10. An external heat radiator 60 is bonded to the internal heat radiator 10 and a solder layer 70 is between the external and the internal heat radiators. The external heat radiator 60 is called "heat radiating fin 60" hereinafter.

The internal heat radiator 10 includes a base 12 and a projection 14 having an exposed area 14a smaller than an element placing surface 16 of the base 12. The projection 14 is substantially at the center of the base 12. The element placing surface 16 of the base 12 is on the side opposite to the projection 14. A semiconductor element 30 is bonded on the substantially central part of the element placing surface 16 through an adhesive layer 36 such as silver paste or the like. The top of the projection 14 is the exposed area 14a.

It is desirable that the internal heat radiator 10 is formed of a highly heat-conductive material such as copper, aluminum, silver, gold or any one of alloys containing these metals as chief components. From the viewpoint of economy, it is particularly preferable that the internal heat radiator 10 is made of copper.

The leads 32 are separated from the semiconductor element 30 by a given distance, with the intermediate portion thereof being supported by the insulator 40. FIG. 2 shows that the leads 32 are electrically connected to electrode pads 30a on the semiconductor element 30 through bonding wires 34 such as gold, silver or other wires.

As shown in FIG. 2, the insulator 40 is continuously formed along the periphery of the element placing surface 16 of the internal heat radiator 10. The insulator 40 is an electrical insulator and capable of supporting the leads 32. The insulator 40 has sufficient thickness to ensure that a space is provided between the internal heat radiator 10, the tips of the leads 32 (inner leads) and wires 34 to minimize deformation and deterioration caused by heat.

The insulator 40 may be formed of any one of insulation resins such as polyimide resin, epoxy resin or the like. It is also preferable that the insulator 40 is in the form of a tape formed by any of the above resins.

A resin package 50 is formed enclosing the semiconductor element 30, the bonding wires 34, portions of the leads 32, the insulator 40 and the internal heat radiator 14 but exposing the exposed area 14a of the internal heat radiator 14.

Figure 3:
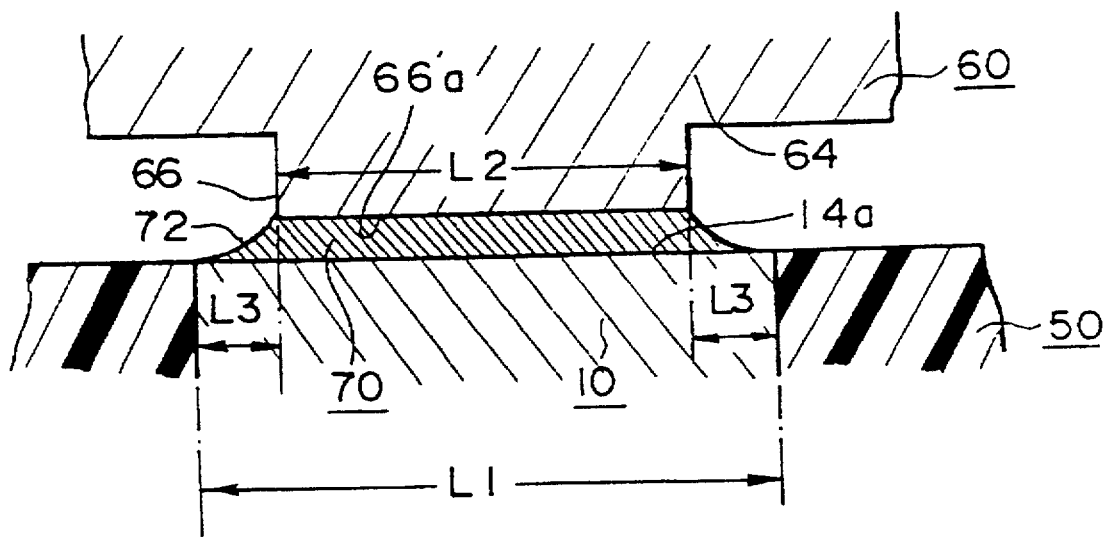
FIG. 3 is an enlarged cross-section, of the bond interface between an internal heat radiator and a heat radiating fin in the semiconductor device shown in FIG. 1.

The heat radiating fin 60 comprises a main body 64, a plurality of protrusions 62 formed on the main body 64 at the top and a protruding portion 66 formed on the main body 64 at the base. The protrusions 66 facilitate specifying the area of the heat radiating fin 60 to be bonded to the internal heat radiator 10. The outer end face or bonding area 66a of the protruding portion 66 is bonded to the exposed area 14a of the internal heat radiator 10 through a solder layer 70. FIG. 3 shows the enlarged bond interface between the internal heat radiator 10 and the heat radiating fin 60. It is desirable that the heat radiating fin 60 is formed of a highly heat-conductive material such as copper, aluminum, silver, gold, iron or any one of alloys containing these metals as chief components. In the viewpoint of economy, it is particularly preferable that the internal heat radiator 10 is made of aluminum.

Figure 4:
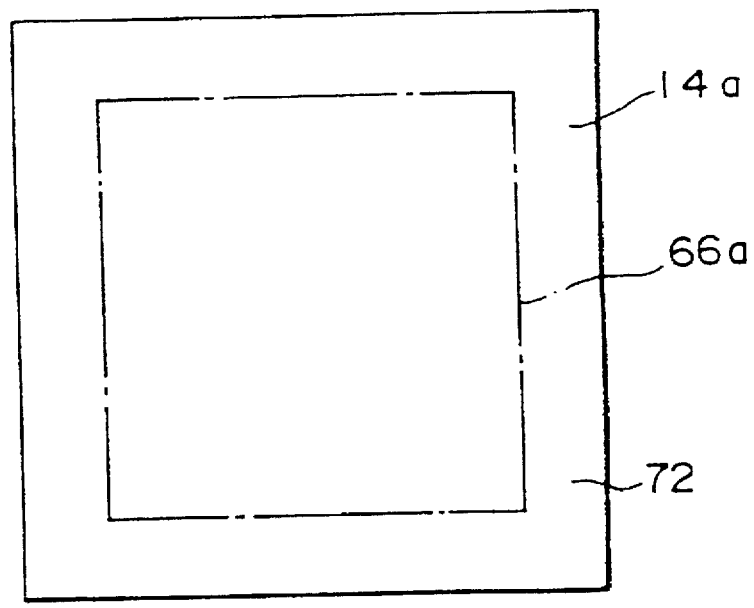
FIG. 4 illustrates the relationship between the exposed area of the internal heat radiator and the bonding area of the heat radiating fin in the semiconductor device of FIG. 1.

In this embodiment, if the exposed area 14a of the internal heat radiator 10 is an area S1, and the bonding area 66a of the protruding portion 66 of the heat radiating fin 60 is an area S2, then S1>S2 a shown in FIG. 4. The configuration of the exposed area 14a is similar to that of the bonding area 66a. In this embodiment, the exposed and bonding areas 14a, 66a are square. However, the configurations of these areas are not limited to be square, but may be of any other configuration such as circular and rectangular.

Since the bonding area 66a is smaller than the exposed area 14a, the solder layer 70 is formed gradually thinner from the periphery of the bonding area 66a toward the periphery of the exposed area 14a, thereby forming a fillet 72, as shown in FIG. 3. The following relationship holds:

$$L1 = L2 + 2 \times L3$$

where L1 is cross-sectional length of the exposed area 14a; L2 is a cross-sectional length of the bonding area 66a; and L3 is the width of the fillet 72.

If such a relationship is considered from the viewpoint of area, the area S1 of the exposed area 14a is set to be larger than the area S2 of the bonding area 66a by an area S3 of the fillet 72 facing the exposed area 14a in the solder layer 70, as shown in FIG. 4.

When the exposed area 14a of the internal heat radiator 10 and the bonding area 66a of the heat radiating fin 60 are formed into the aforementioned configurations and dimensions, the internal heat radiator and heat radiating fin 10, 60 can be bonded to each other so that the bonding area 66a is substantially centrally located on the exposed area 14a without any positioning step, as shown in FIG. 4. Such an advantage will be described in detail with reference to FIG. 5.

Figure 5:
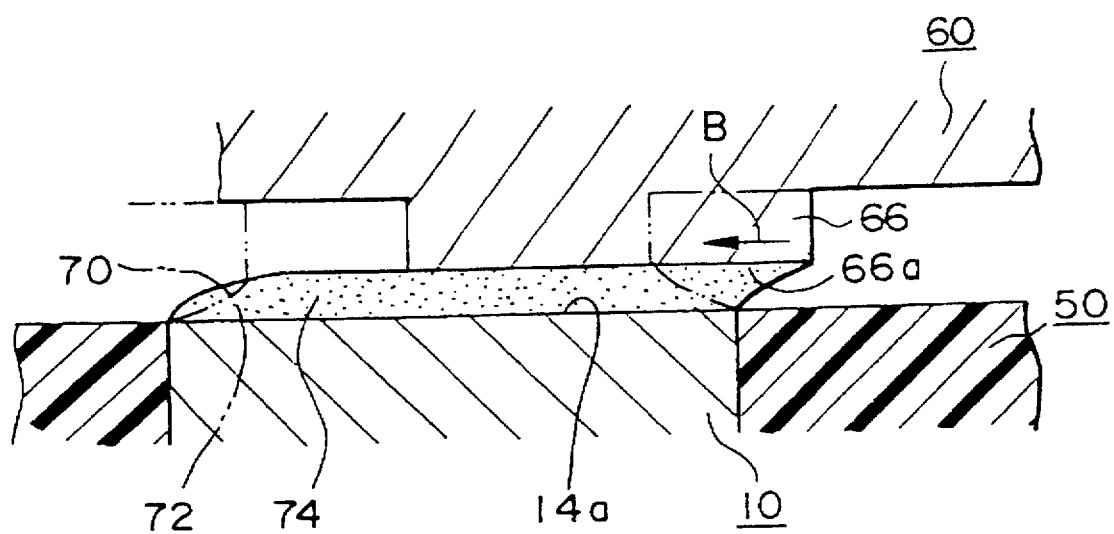
FIG. 5 illustrates the movement of the heat radiating fin under the surface tension of a molten solder layer.

In FIG. 5, a solid line represents a state in which the heat radiating fin 60 is shifted to the right from a predetermined location, while a chain line indicates another state in which the heat radiating fin 60 is properly bonded to the internal heat radiator 10 at the predetermined location. When the protruding portion 66 of the heat radiating fin 60 is first placed on the molten solder layer 74, the bonding area 66a adheres to the molten solder layer 74 under the molten solder layer's surface tension. The surface tension is the adhesive force between the molten solder layer 74 and the bonding area 66a. In addition, a molten solder cohesive force acts on the heat radiating fin 60, and attracts it toward the central part of the molten solder layer 74, as shown by arrow B in FIG. 5. The surface tension moves the heat radiating fin 60 on the surface of the molten solder layer 74. The heat radiating fin 60 stops at a point where the surface tension substantially uniformly acts on all the outer edges of the bonding area 66a.

The exposed area 14a of the internal heat radiator 10 and the bonding area 66a of the heat radiating fin 60 are symmetrical and similar in configuration in this embodiment as described. Therefore, the above point where the surface tension substantially uniformly acts on all the peripheral points of the bonding area 66a is a point where the center of the exposed area 14a coincides with that of the bonding area 66a. In other words, the bonding area 66a would be centrally disposed over the exposed area 14a. According to this embodiment, therefore, the bonding area 66a can be automatically positioned on and bonded to the substantially central part of the exposed area 14a by utilizing the surface tension of the molten solder layer 74.

The semiconductor device 100 having the above configuration can provide a relatively high heat radiating effect by bonding the internal heat radiator 10 to the semiconductor element 30 which is a main heat source, and also by providing the heat radiating fin 60 on the exposed area 14a. In other words, the internal heat radiator 10 and heat radiating fin 60, which are formed of metal, can be bonded to each other by soldering. The heat conductivity of the internal heat radiator 10 and the heat radiating fin 60 acting as one heat radiating member is increased resulting in a more effective heat radiation. In addition, the solder layer bond between the internal heat radiator and heat radiating fin 10 and 60 can be sufficiently increased to provide higher mechanical strength.

If a cross-section of the internal heat radiator 10 has an inverted T-shape, the surface area can be increased to provide further improved heat radiation. Since it is possible to increase the distance between the exposed area 14a and the element placing surface 16 on which the semiconductor element 30 is placed, the semiconductor element 30 can be prevented from being degraded by any external matter such as gas or moisture.

In this embodiment the exposed and bonding areas 14a, 66a are formed into the aforementioned configurations and dimensions and also bonded to each other through the solder layer 70. Therefore, the heat radiating fin 60 can be automatically positioned by utilizing the surface tension of the molten solder, when they are to be bonded to each other. This enables the assembly to be easy and reliable.

Figure 6A:
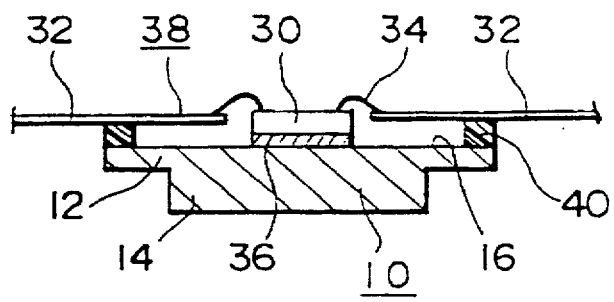
FIGS. 6A, 6B and 6C are cross-sections showing a process of making the semiconductor device shown in FIG. 1.
Figure 6B:
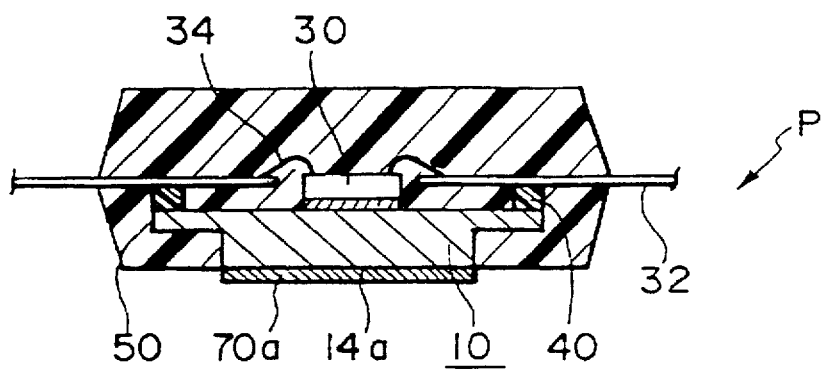
Figure 6C:
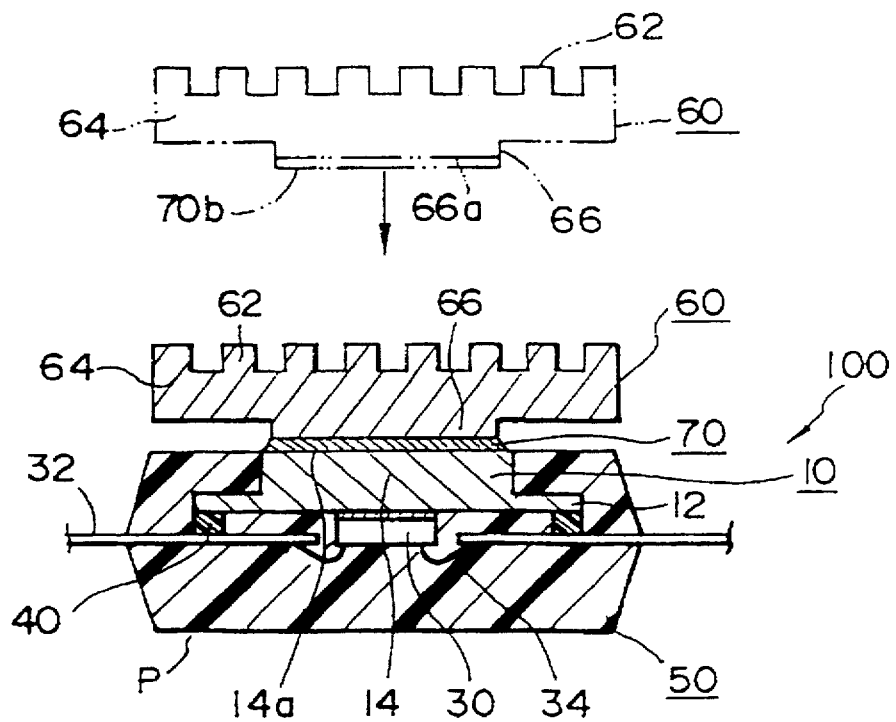
Figure 7:
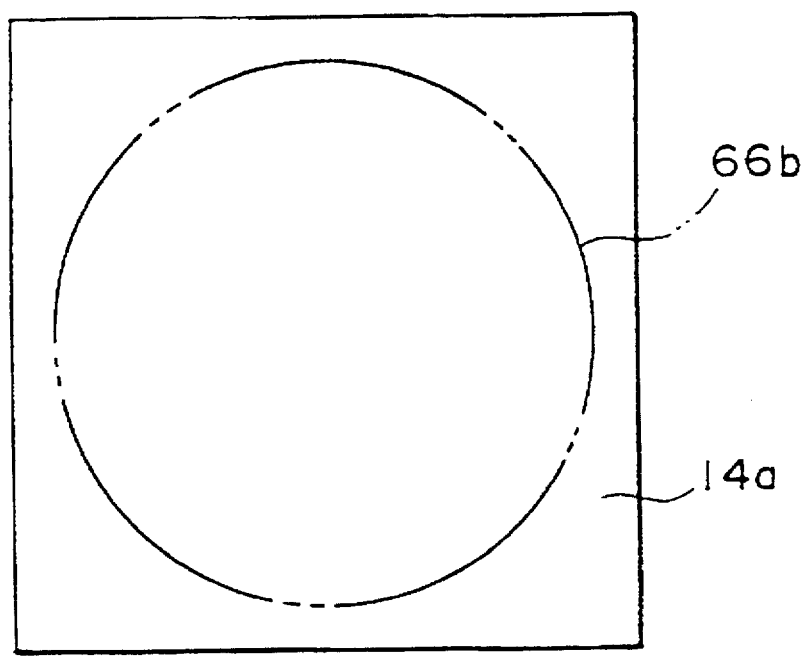
FIG. 7 illustrates modified configurations of the exposed and bonding areas of the internal heat radiator and heat radiating fin.

FIGS. 6A to 6C are cross-sectional views schematically showing a fabrication process of the semiconductor device 100. The semiconductor element 30 is first bonded to the element placing surface 16 of the internal heat radiator 10 at a predetermined position. The adhesive layer 36, such as silver paste, is disposed between the semiconductor element 30 and the element placing surface 16, as shown in FIG. 6A. The insulator 40 is then disposed along the periphery of the element placing surface 16 as shown in FIG. 2. The lead frame 38 including a plurality of leads 32 is then disposed on the insulator 40. These three members are then thermally pressurized and bonded together, by using any suitable adhesive such as epoxy resin, so that the internal heat radiator 10, insulator 40 and lead frame 38 are bonded together into a unit.

The process and sequence for bonding the internal heat radiator 10, semiconductor element 30, insulator 40 and lead frame 38 together is not limited to any particular technique.

The electrode pads 30a of the semiconductor element 30 are then electrically connected to the respective leads 32 through the wires 34 in a given wiring pattern.

As shown in FIG. 6B, the resin package 50 is molded by a conventional molding technique to form a complete package P. At this point, the exposed area 14a of the internal heat radiator 10 is left exposed from the resin package 50. More particularly, the semi-assembly formed in the step of FIG. 6A is set within a cavity under such a condition that the bottom wall of a mold (not shown) is in contact with the exposed area 14a. The resin material is sealingly injected into the cavity in such a way that the exposed area 14a will not be covered by the resin package 50, and the exposed area 14a will be left exposed.

If the internal heat radiator 10 is made of copper, the exposed area 14a may be coated with a film of nickel or solder. Thus, it is possible to prevent the formation of a patina on the exposed area 14a, in spite of a time interval between the processing steps.

A first solder layer 70a is then formed over the entire exposed area 14a of the internal heat radiator 10. The film thickness of the first solder layer 70a is selected depending on factors such as the required amount of molten solder and the dimension of the bonding area 66a of the heat radiating fin 60.

If the exposed area 14a is coated with a nickel film, it is preferable that a solder is plated over the exposed area 14a through the electro-plating process, since it is difficult to adhere solder to nickel. It is also preferable that the solder plating is formed by the electro-plating process at the same time when the leads 32 are plated with solder.

As shown in FIG. 6C, the heat radiating fin 60 is then bonded to the internal heat radiator 10. In this step, a second solder layer 70b is first formed on the bonding area 66a.

If the heat radiating fin 60 is formed of aluminum, it is preferable that the second solder layer 70b is formed after the bonding area 66a is previously plated with solder through the electro-plating process, because the solder does not adhere to aluminum. Alternatively, the bonding area 66a may be coated with a metallic film containing an alloy such as tin, silver, gold or palladium which can mix with the solder. In place of such a metallic film, the bonding area 66a may be previously washed by ion plasma.

The heat radiating fin 60 is pre-heated preferably to temperatures ranging from about 180° to 250° C., and more preferably about 180° to 200° C., by any heating means (not shown). It is desirable that such heating means also functions as support means (handler) for detachably holding the heat radiating fin 60, and for moving it from a given position to a bonding position. The lower temperature limit 180° C. substantially corresponds to the melt temperature of the solder. If the temperature of the heat radiating fin 60 and particularly its protruding portion 66 is lower than 180° C., the solder cannot be sufficiently fused when the bonding is carried out. The upper temperature limit 250° C. is set based on the thermal stress applied to the package P which is obtained through the process shown in FIG. 6B. If the temperature of the heat radiating fin 60 is higher than 250° C., an excess thermal stress will be undesirably applied to the semiconductor element 30 and resin package 50, when the heat radiating fin 60 is brought into contact with the internal heat radiator 10.

On the other hand, the resin package 50 is preferably pre-heated to temperatures ranging from about 100° to 200° C. and more preferably about 125° to 180° C. By pre-heating the resin package 50, the thermal stress on the package P can be controlled when it is brought into contact with the heat radiating fin 60 having a higher temperature. If the pre-heating temperature is lower than about 100° C., the temperature of the package P increases rapidly when it is brought into contact with the heat radiating fin 60 having a higher temperature and the thermal stress is insufficiently controlled. A pre-heating temperature above about 200° C. gives an adverse effect on the semiconductor element 30.

According to the invention, since the heat radiating fin 60 is positioned by the surface tension of the molten solder layer 74, the above temperature range accounts for the surface tension of the molten solder layer 74 which is temperature dependent.

After pre-heating the heat radiating fin 60 and the resin package 50, the heat radiating fin 60 is moved downward toward the exposed area 14a so that the first solder layer 70a is brought into contact with the second solder layer 70b. The first solder layer 70a is fused by the heat from the heat radiating fin 60 to form the molten solder layer 74. The heat radiating fin 60 placed on the surface of the molten solder layer 74 has its protruding portion 66 substantially centrally located on the exposed area 14a as discussed above with FIG. 5. The molten solder layer 74 is cooled to form the solder layer 70.

Finally, the lead frame, frames and dam bars are cut off by conventional means. The outer leads externally extending from the lead frame or solder plating are bent.

The semiconductor device 100 of this embodiment is formed through the above series of operations. The invention is not limited to the above embodiment, but may be applied in any of various modifications and changes. For example, similar configurations of the exposed and bonding areas 14a, 66a of the internal heat radiator and heat radiating fin 10, 60 may be changed to any of various configurations. It is preferable that the exposed and bonding areas 14a, 66a are symmetrical to each other in view of the uniform surface tension of the molten solder acting on them. The exposed and bonding areas 14a, 66a may be different in configuration from each other. For example, the exposed area 14a may be rectangular while the bonding area 66a may be circular.

Although the above embodiment has been described as to the first and second solder layers 70a, 70b formed on the exposed and bonding areas 14a, 66a, a single solder layer 70 may be formed on one of the exposed and bonding areas 14a, 66a. It is preferable that the solder layer 70 is formed on the exposed area 14a of the internal heat radiator 10 having a larger dimension.

It is preferable that the dimension S1 of the exposed area 14a is larger than the dimension S2 of the bonding area 66a. Nevertheless, in view of the accurate positioning of the heat radiating fin, the object of the invention can be accomplished when these dimensions S1 and S2 are identical.

Figure 8:
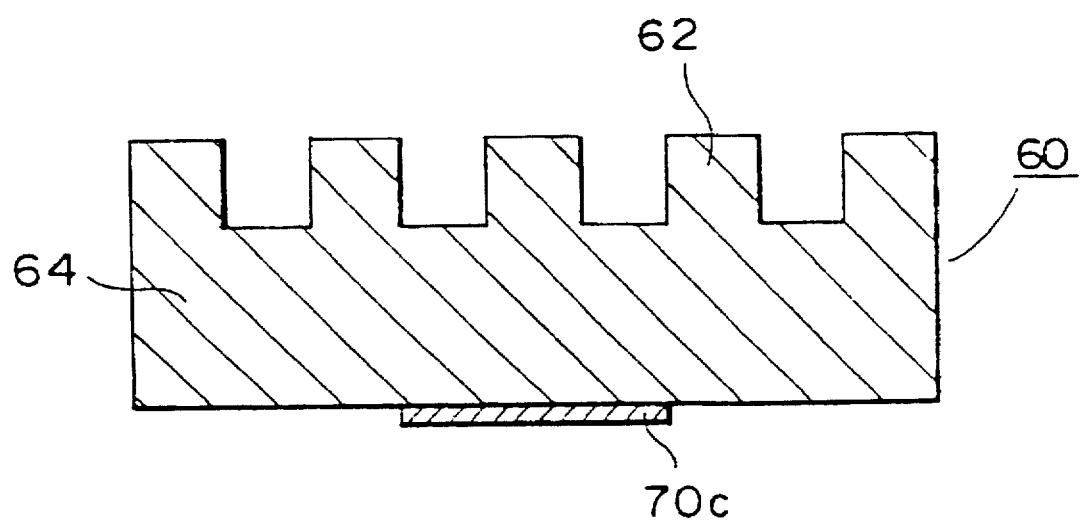
FIG. 8 is a cross-sectional view of a modified heat radiating fin.

The configuration and dimensions of the internal and external heat radiators are not limited to those in the above embodiment. For example, the protruding portion 66 in the heat radiating fin may be omitted. As shown in FIG. 8, the solder layer 70C may be formed on define a bonding region on a flat surface. The shape of the projections forming the heat radiating fin may be modified.

The above embodiment has been described as to the semiconductor element being bonded directly to the internal heat radiator. However, the invention can be similarly applied to a structure that allows the semiconductor element to be bonded to the islands of the lead frame on one side, while the internal heat radiator is bonded to the other side of the same lead frame.

Figure 9:
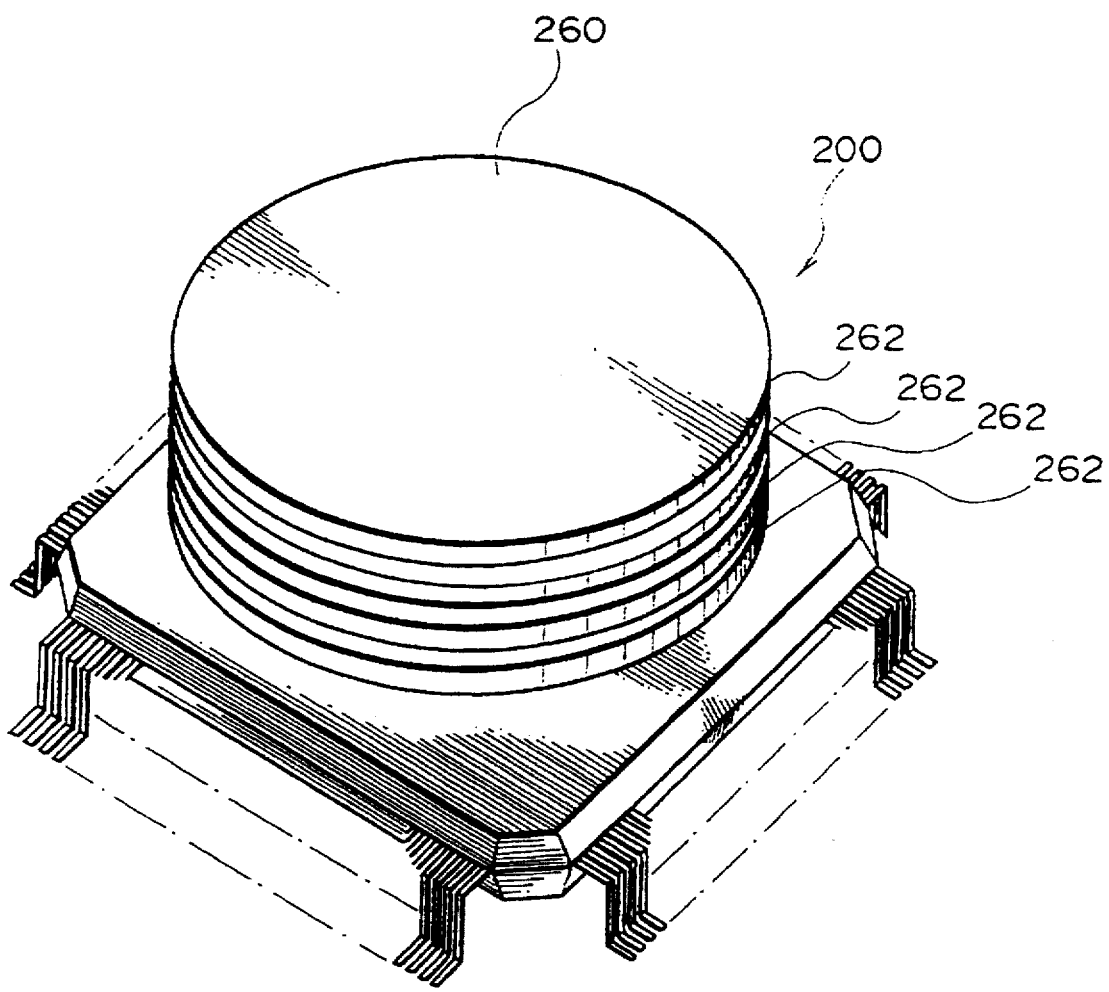
FIG. 9 illustrates another embodiment of the semiconductor device.
Figure 10:
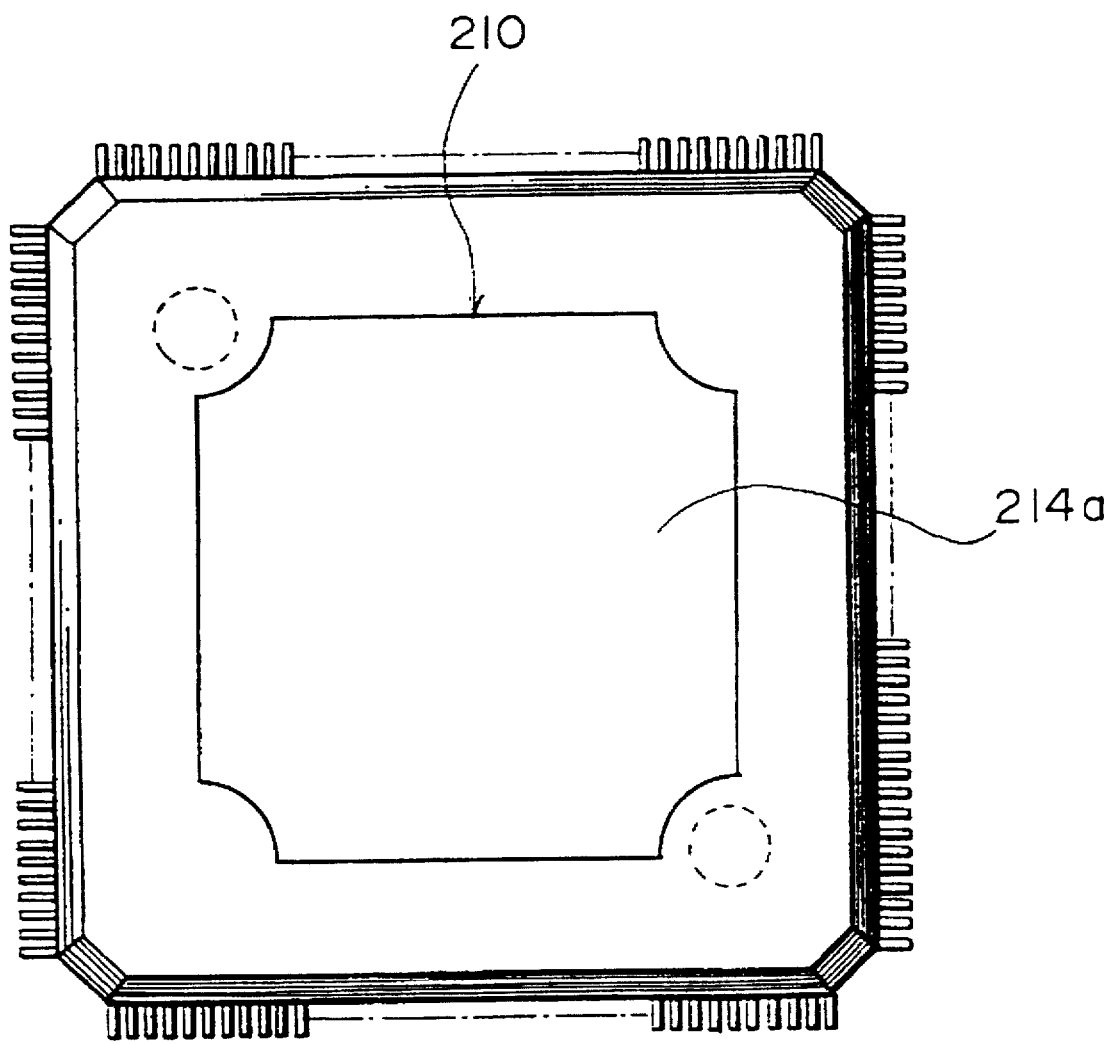
FIG. 10 illustrates the semiconductor device shown in FIG. 9.

FIG. 9 illustrates another embodiment of the semiconductor device constructed in accordance with the invention. FIG. 10 illustrates the semiconductor device shown in FIG. 9, without the external heat radiator.

In FIG. 9, an external heat radiator 260 includes four disc portions 262 which are separated from one another by a given distance and centrally connected to one another through a reduced-diameter column (not shown). In such a case, most of the opposite sides of each disc portion 262 will be exposed to increase the entire area of the external heat radiator 260. Thus, the external heat radiator 260 can be more effectively air-cooled. The material of the external heat radiator 260 is similar to that of the external heat radiator 60 of FIG. 1.

The heat radiation can be further improved by blacking the surface of the external heat radiator 260. Higher level of radiation is emitted by a darker color surface. If the external heat radiator 260 is formed of aluminum, the blacking may be carried out by wet oxidizing the aluminum.

Since it is difficult to adhere aluminum to the solder, it is preferable that the bonding area of the external heat radiator 260 that is bonded to the exposed area 214a of the internal heat radiator 210 is previously plated with solder through the electro-plating process. Two kinds of processes are considered depending on whether the oxidization or the solder plating is carried out first.

If the solder plating is initially performed, the parts of the external heat radiator 260 which will not be plated by solder is first covered with resist and then the entire external heat radiator 260 is plated with solder. After the resist has been removed, the solder plated parts are covered with resist and then blacked through the oxidization. Such a process requires two steps for covering the external heat radiator 260 with resist.

If oxidization is carried out before the solder plating, the parts which are to be solder plated are covered with resist before the external heat radiator 260 is blacked. Then, the resist is removed and the unblacked parts of the external heat radiator 260 are finally plated with solder. Such a process only requires a single step of covering the external heat radiator 260 with resist.

As shown in FIG. 10, the configuration of the exposed area 214a of the internal heat radiator 210 is different from that of the exposed area 14a of the internal heat radiator 10 in the semiconductor device 100 of FIG. 1. The exposed area 214a is of such a configuration that each of the four corners has a rounded recess for the following reason.

In the process of making the semiconductor device 200, it is required that the internal heat radiator 210 is disposed with its exposed area 214a in contact with the cavity wall of a mold to be used, so as to prevent the exposed area 214a from being covered with resin, as in the semiconductor device 100. In the resin molding step, a molded article is separated from the mold by outwardly pushing an ejector pin from the mold. The ejector pin slightly extends outwardly from the cavity wall of the mold during the resin injection, such that any convex part will not be formed on the molded article. If the ejector pin is brought into contact with the exposed area 214a, a gap will be formed between the cavity wall of the mold and the exposed area 214a, resulting the penetration of the resin material. To avoid this problem of resin penetration, the exposed area 214a is formed into the aforementioned configuration, as shown by broken line in FIG. 10.

All the four corners of the square exposed area 214a have rounded recesses. Therefore, it is not required to determine the direction of the semiconductor device 200 even if a molded article is to be separated from the mold by using two ejector pins. In other words, the exposed area 214a can be released from the ejector pins, even if the semiconductor device 200 is rotated from the position of FIG. 10 by 90 degrees. Other structures besides the above structure are disclosed in JP 5-55410.

The external heat radiator 260 of FIG. 9 have four disc portions, but any number of disc portions may be used depending on the heat dissipation that is required.

FIGS. 11A to 11E schematically show a process of mounting an external heat radiator 360 having three disc portions 362 on the exposed area 314a of a resin sealed internal heat radiator 310.

Referring to FIG. 11A, the exposed area 314a includes a solder layer 370 formed thereon by solder paste. More particularly, the exposed area 314a is plated with solder to form a solder plating on which the solder layer 370 is formed.

FIG. 11B shows an external heat radiator 360 placed on the solder layer 370. More particularly, solder is plated on the bonding area 366a of the external heat radiator 360 to form a solder plating which is in contact with the solder layer 370.

After the external heat radiator 360 is placed on the exposed area 314a having the solder layer 370 therebetween, a resin package 350 is heated by a heater 380, as shown in FIG. 11C. This heating prevents any damages to the resin package 350 caused by rapidly heating the molten solder layer 370. It is preferable that the heating is performed at about 125° C.

As shown in FIG. 11D, the external heat radiator 360 is then heated to a temperature ranging between about 180° C. and 200° C. by another heater 390 to fuse the solder layer 370. At this point, it is preferable that the resin package 350 continues to be heated by the heater 380.

When the solder layer 370 is fused, the bonding area 366a of the external heat radiator 360 is attracted toward the central part of the exposed area 314a through the surface tension of the molten solder, resulting in a state as shown in FIG. 11E.

Thus, the semiconductor device 300 is produced through the above steps. The semiconductor device 300 is mounted on a substrate after the solder supplied to the leads through the reflow step has been fused.

Figure 12:
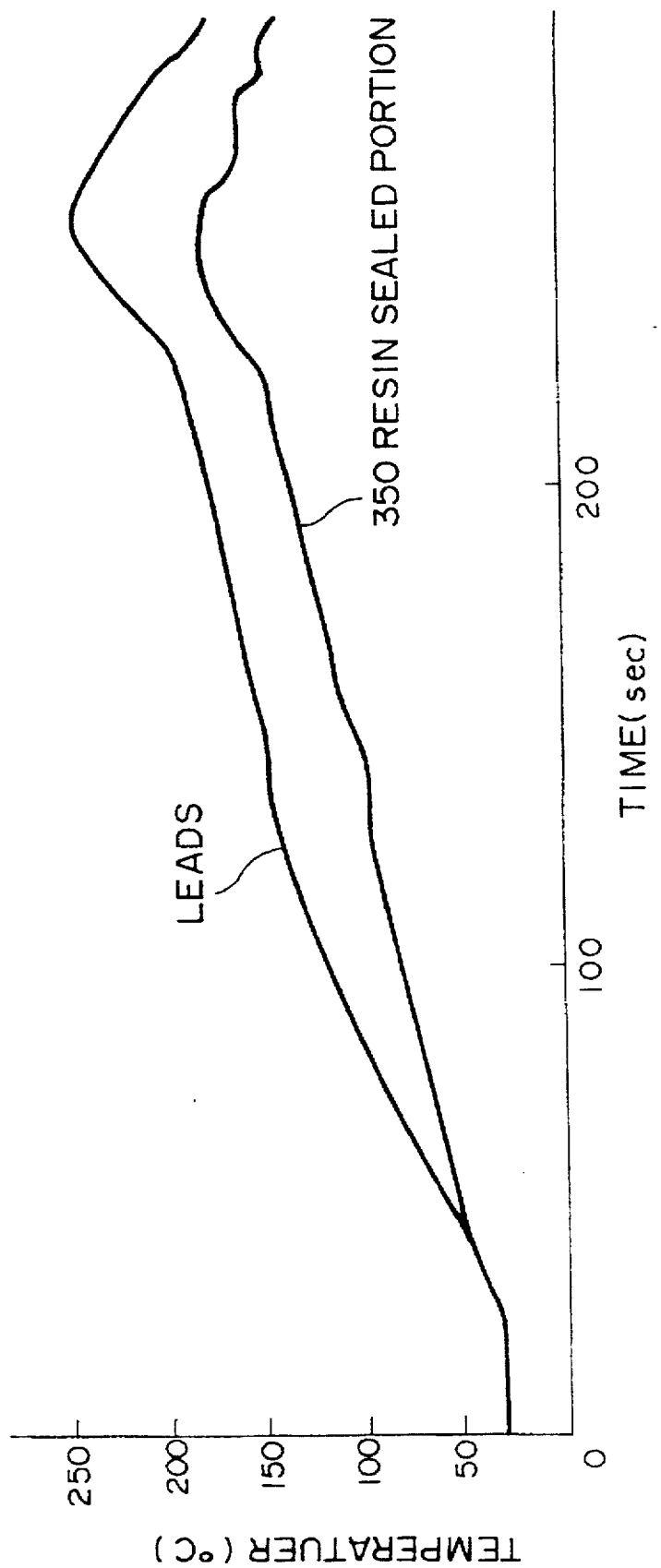
FIG. 12 illustrates temperatures of the semiconductor device during the reflow step.
Figure 13:
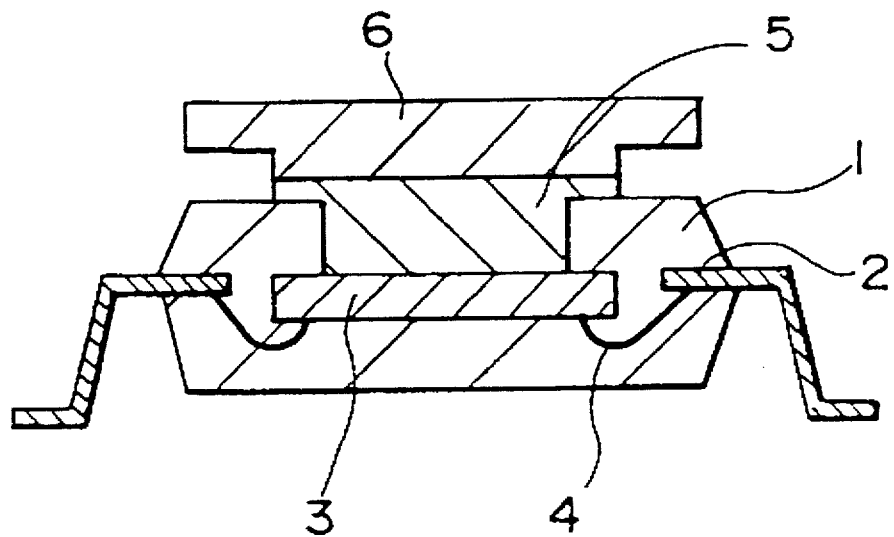
FIG. 13 is a cross-sectional view of a conventional semiconductor device which has a heat radiating fin.

FIG. 12 is a graph showing the temperatures of the semiconductor device 300 during the reflow step. In this graph, the maximum temperature of the leads is 245° C. If the semiconductor device does not have an external heat radiator, the surface of the resin package also becomes equal to about the same temperature. On the other hand, the semiconductor device 300 of this embodiment limits the maximum temperature of the resin package 350 to about 170° C. This temperature is obtained by cooling the resin package 350 through the external heat radiator 360. The solder layer 370, adhering the external heat radiator 360 to the internal heat radiator 310, will not fuse unless the temperature reaches about 180° C. Therefore, the solder layer 370 will not fuse when the maximum temperature at the resin package 350 is 170° C. The external heat radiator 360 will not be separated from the internal heat radiator 310. Thus, this embodiment can provide superior effects also in the adhesion of the external heat radiator 360.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. A resin sealing type semiconductor device comprising:
    a semiconductor element;
    an internal heat radiator, the semiconductor element being mounted on an element placing surface of the internal heat radiator;
    a resin package, the resin package sealing the internal heat radiator and defining a portion of the internal heat radiator as an exposed area;
    a solder layer disposed on the exposed area of the internal heat radiator; and
    an external heat radiator, the external heat radiator being mounted on the internal heat radiator and bonded to the solder layer, the external heat radiator being bonded to the solder layer at a bonding area, the bonding area being equal to or less than the exposed area, wherein a center of the exposed area and a center of the bonding area being made to substantially coincide by a surface tension formed by melting the solder layer.

2. The resin sealing type semiconductor device of claim 1, wherein the bonding area is smaller than the exposed area and the resin sealing type semiconductor device further comprises:
    leads that are separated from the semiconductor element;
    wires electrically connecting the leads with electrodes of the semiconductor element; and
    an insulator disposed between the internal heat radiator and the leads.

3. The resin sealing type semiconductor device of claim 1, wherein a fillet of solder is formed by the surface tension when the solder layer is melted, the fillet is formed over a fillet area between the exposed area and the bonding area, the bonding area is smaller than the exposed area by the fillet area.

4. The resin sealing type semiconductor device of claim 1, further comprising:
    leads that are separated from the semiconductor element;
    wires electrically connecting the leads with electrodes of the semiconductor element; and
    an insulator disposed between the internal heat radiator and the leads.

5. A resin sealing type semiconductor device comprising:
    a semiconductor element;
    an internal heat radiator, the semiconductor element being mounted on an element placing surface of the internal heat radiator;
    leads that are separated from the semiconductor element;
    wires electrically connecting the leads with electrodes of the semiconductor element;
    an insulator disposed between the internal heat radiator and the leads;
    a resin package, the resin package sealing the internal heat radiator defining a portion of the internal heat radiator as an exposed area;
    a solder layer disposed on the exposed area of the internal heat radiator; and
    an external heat radiator, the external heat radiator being mounted on the internal heat radiator and bonded to the solder layer, the external heat radiator being bonded to the solder layer at a bonding area, the bonding area being equal to or less than the exposed area, wherein a center of the exposed area and a center of the bonding area being made to substantially coincide by a surface tension formed by melting the solder layer.

6. The resin sealing type semiconductor device of claim 5, wherein a fillet of solder is formed by the surface tension when the solder layer is melted, the fillet is formed over a fillet area between the exposed area and the bonding area, the bonding area is smaller than the exposed area by the fillet area.

7. A resin sealing type semiconductor device comprising:

a semiconductor element;

an internal heat radiator, the semiconductor element being mounted on an element placing surface of the internal heat radiator;

a resin package, the resin package sealing the internal heat radiator and defining a portion of the internal heat radiator as an exposed area;

a solder layer disposed on the exposed area of the internal heat radiator; and an external heat radiator, the external heat radiator being mounted on the internal heat radiator and bonded to the solder layer, the external heat radiator being bonded to the solder layer at a bonding area, wherein the bonding area is smaller than the exposed area.

8. The resin sealing type semiconductor device of claim 7, wherein the bonding area is attracted toward a central part of the exposed area by a surface tension formed by melting the solder layer and the resin sealing type semiconductor device further comprises:

leads that are separated from the semiconductor element;

wires electrically connecting the leads with electrodes of the semiconductor element; and an insulator disposed between the internal heat radiator and the leads.

9. The resin sealing type semiconductor device of claim 7, wherein a fillet of solder is formed by the surface tension when the solder layer is melted, the fillet is formed over a fillet area between the exposed area and the bonding area, the bonding area is smaller than the exposed area by the fillet area.

10. The resin sealing type semiconductor device of claim 9, wherein a shape of the exposed area is similar to a shape of the bonding area.

11. The resin sealing type semiconductor device of claim 7, further comprising:

leads that are separated from the semiconductor element;

wires electrically connecting the leads with electrodes of the semiconductor element; and an insulator disposed between the internal heat radiator and the leads.

12. A resin sealing type semiconductor device comprising:

a semiconductor element;

an internal heat radiator, the semiconductor element being mounted on an element placing surface of the internal heat radiator;

leads that are separated from the semiconductor element;

wires electrically connecting the leads with electrodes of the semiconductor element;

an insulator disposed between the internal heat radiator and the leads;

a resin package, the resin package sealing the internal heat radiator and defining a portion of the internal heat radiator as an exposed area;

a solder layer disposed on the exposed area of the internal heat radiator; and an external heat radiator, the external heat radiator being mounted on the internal heat radiator and bonded to the solder layer, the external heat radiator being bonded to the solder layer at a bonding area, wherein the bonding area is smaller than the exposed area.

13. The resin sealing type semiconductor device of claim 12, wherein a fillet of solder is formed by the surface tension when the solder layer is melted, the fillet is formed over a fillet area between the exposed area and the bonding area, the bonding area is smaller than the exposed area by the fillet area.

14. The resin sealing type semiconductor device of claim 13, wherein a shape of the exposed area is similar to a shape of the bonding area.

15. The resin sealing type semiconductor device of claim 14, further comprising an element receiver, the element receiver being mounted on the internal heat radiator and the semiconductor element being mounted on an element placing surface of the element receiver.

16. A resin sealing type semiconductor device comprising:

a semiconductor element;

an internal heat radiator, the semiconductor element being mounted on an element placing surface of the internal heat radiator;

a resin package, the resin package sealing the internal heat radiator and defining a portion of the internal heat radiator as an exposed area;

a solder layer disposed on the exposed area of the internal heat radiator; and an external heat radiator, the external heat radiator being mounted on the internal heat radiator and bonded to the solder layer, the external heat radiator being bonded to the solder layer at a bonding area, and the bonding area being equal to the exposed area.

17. A resin sealing type semiconductor device comprising:

a semiconductor element;

an internal heat radiator, the semiconductor element being mounted on an element placing surface of the internal heat radiator;

leads that are separated from the semiconductor element;

wires electrically connecting the leads with electrodes of the semiconductor element;

an insulator disposed between the internal heat radiator and the leads;

a resin package, the resin package sealing the internal heat radiator and defining a portion of the internal heat radiator as an exposed area;

a solder layer disposed on the exposed area of the internal heat radiator; and an external heat radiator, the external heat radiator being mounted on the internal heat radiator and bonded to the solder layer, the external radiator being bonded to the solder layer at a bonding area, and the bonding area being equal to the exposing area.

18. A resin sealing type semiconductor device comprising:

a semiconductor element;

an internal heat radiator, the semiconductor element being mounted on an element placing surface of the internal heat radiator;

a resin package, the resin package sealing the internal heat radiator and defining a portion of the internal heat radiator as an exposed area;

a solder layer disposed on the exposed area of the internal heat radiator; and an external heat radiator, the external heat radiator being mounted on the internal heat radiator and bonded to the solder layer, the external heat radiator having a base portion, the base portion having a bonding area in its center for being bonded to the solder layer, the bonding area being equal to or less than the exposed area, and a center of the exposed area and the center of the bonding area being made to substantially coincide by a surface tension formed by melting the solder layer.

19. The resin sealing type semiconductor device of claim 18, wherein the base portion has a protruding portion, the protruding portion has an outer end face, and the outer end face is the bonding area.

20. A resin sealing type semiconductor device comprising:

a semiconductor element;

an internal heat radiator, the semiconductor element being mounted on an element placing surface of the internal heat radiator;

leads that are separated from the semiconductor element;

wires electrically connecting the leads with electrodes of the semiconductor element;

an insulator disposed between the internal heat radiator and the leads;

a resin package, the resin package sealing the internal heat radiator and defining a portion of the internal heat radiator as an exposed area;

a solder layer disposed on the exposed area of the internal heat radiator; and an external heat radiator, the external heat radiator being mounted on the internal heat radiator and bonded to the solder layer, the external heat radiator having a base portion, the base portion having a bonding area in its center for being bonded to the solder layer, the bonding area being equal to or less than the exposed area, and a center of the exposed area and the center of the bonding area being made to substantially coincide by a surface tension formed by melting the solder layer.

21. The resin sealing type semiconductor device of claim 20, wherein the base portion has a protruding portion, the protruding portion has an outer end face, and the outer end face is the bonding area.

\* \* \* \* \*

UNITED STATES PATENT AND TRADEMARK OFFICE
CERTIFICATE OF CORRECTION

PATENT NO.  : 5,719,442
DATED       : February 17, 1998
INVENTOR(S) : Tetsuya Otsuki It is certified that error appears in the above-identified patent and that said Letters Patent is hereby corrected as shown below:

Please add claims 22-40 as follows:

-- 22. A method of making a resin scaling type semiconductor device comprising:

mounting leads on an internal heat radiator;
mounting a semiconductor element on an element placing surface of the internal heat radiator;
electrically connecting the leads to electrodes of the semiconductor element with wires;
sealing the internal heat radiator with a resin package;
defining a portion of the internal heat radiator as an exposed area using the resin package;
bonding the exposed area of the internal heat radiator to a bonding area of an external heat radiator using a solder layer, the bonding area being equal to or less than the exposed area; and
melting the solder to produce a surface tension, the bonding area being attracted toward a central part of the exposed area by the surface tension, wherein a center of the exposed area and a center of the bonding area being made to substantially coincide by the surface tension formed by melting the solder layer.

-- 23. A method of making a resin sealing type semiconductor device comprising:

mounting leads on an internal heat radiator through an insulator;
mounting a semiconductor element on an element placing surface of the internal heat radiator;
electrically connecting the leads to electrodes of the semiconductor element with wires;
sealing the internal heat radiator with a resin package;
defining a portion of the internal heat radiator as an exposed area using the resin package; and
bonding the exposed area of the internal heat radiator to a bonding area of an external heat radiator using a solder layer, the bonding area being smaller than the exposed area.

24. The method of making a resin sealing type semiconductor device of claim 16, wherein before bonding the exposed area of the internal heat radiator, the solder layer is formed on each of the exposed and the bonding areas.

25. The method of making a resin sealing type semiconductor device of claim 17, wherein before bonding the exposed area of the internal heat radiator, the solder layer is formed on each of the exposed and the bonding areas.

UNITED STATES PATENT AND TRADEMARK OFFICE
CERTIFICATE OF CORRECTION

PATENT NO.    : 5,719,442
DATED         : February 17, 1998
INVENTOR(S)   : Tetsuya Otsuki It is certified that error appears in the above-identified patent and that said Letters Patent is hereby corrected as shown below:

26. The method of making a resin sealing type semiconductor device of claim 16, wherein before bonding the exposed area of the internal heat radiator, the solder layer is formed on the exposed area.

27. The method of making resin sealing type semiconductor device of claim 17, wherein before bonding the exposed area of the internal heat radiator, the solder layer is formed on the exposed area.

28. The method of making a resin sealing type semiconductor device of claim 20, wherein while melting the solder, the solder layer is heated after heating the external heat radiator to a temperature range of about 180 to 250°C.

29. The method of making a resin sealing type semiconductor device of claim 21, wherein while melting the solder, the solder layer is heated after heating the external heat radiator to a temperature range of about 180 to 250°C.

30. The method of making a resin sealing type semiconductor device of claim 16, wherein while melting the solder, the solder layer is heated after heating the resin package to a temperature range of about 100 to 200°C.

31. The method of making a resin sealing type semiconductor device of claim 17, wherein while melting the solder, the solder layer is heated after heating the resin package to a temperature range of about 100 to 200°C.

32. The method of making a resin sealing type semiconductor device of claim 18, wherein while melting the solder, the solder layer is heated after heating the resin package to a temperature range of about 100 to 200°C.

33. The method of making a resin sealing type semiconductor device of claim 19, wherein while melting the solder, the solder layer is heated after heating the resin package to a temperature range of about 100 to 200°C.

34. The method of making a resin sealing type semiconductor device of claim 20, wherein while melting the solder, the solder layer is heated after heating the resin package to a temperature range of about 100 to 200°C.

35. The method of making a resin sealing type semiconductor device of claim 21, wherein while melting the solder, the solder layer is heated after heating the resin package to a temperature range of about 100 to 200°C.

UNITED STATES PATENT AND TRADEMARK OFFICE
CERTIFICATE OF CORRECTION

PATENT NO. : 5,719,442
DATED : February 17, 1998
INVENTOR(S) : Tetsuya Otsuki

It is certified that error appears in the above-identified patent and that said Letters Patent is hereby corrected as shown below:

36. The method of making a resin sealing type semiconductor device of claim 22, where in while melting the solder, the solder layer is heated after heating the resin package to a temperature range of about 100 to 200°C.

37. The method of making a resin sealing type semiconductor device of claim 23, wherein while melting the solder, the solder layer is heated after heating the resin package to a temperature range of about 100 to 200°C.

38. The method of making a resin sealing type semiconductor device of claim 31, further comprising:
    mounting the semiconductor element on an element receiver; and
    fixing the element receive on the internal heat radiator.

39. The method of making a resin sealing type semiconductor device of claim 16, wherein the bonding area is smaller than the exposed area.

40. The method of making a resin sealing type semiconductor device of claim 17, further comprising melting the solder to produce a surface tension, the bonding area being attracted toward a central part of the exposed area by the surface tension. --

Signed and Sealed this

Twenty-second Day of January, 2002

Attest:

Attesting Officer

JAMES E. ROGAN
*Director of the United States Patent and Trademark Office*